(12) United States Patent
Shimada et al.

(10) Patent No.: US 7,879,642 B2
(45) Date of Patent: Feb. 1, 2011

(54) SOLID-STATE SENSOR AND MANUFACTURING METHOD THEREOF

(75) Inventors: Hidetoshi Shimada, Ibaraki (JP); Karuya Mori, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 637 days.

(21) Appl. No.: 11/763,532

(22) Filed: Jun. 15, 2007

(65) Prior Publication Data
US 2007/0290285 A1 Dec. 20, 2007

(30) Foreign Application Priority Data
Jun. 15, 2006 (JP) ............................. 2006-166719

(51) Int. Cl.
*H01L 21/00* (2006.01)
(52) U.S. Cl. ................. 438/79; 257/E21.185
(58) Field of Classification Search ................ 438/79, 438/77, 75; 257/E21.185, E21.456
See application file for complete search history.

(56) References Cited

U.S. PATENT DOCUMENTS 5,118,631 A * 6/1992 Dyck et al. ................. 438/79

* cited by examiner

*Primary Examiner*—Lex Malsawma
(74) *Attorney, Agent, or Firm*—John J. Patti; Wade J. Brady, III; Frederick J. Telecky, Jr.

(57) ABSTRACT

A sensor having photodiodes whose sensitivity and storage capacity can be increased is provided. The sensor is formed by arranging the photodiodes in an array with first region of second conductivity type is formed on the principal surface of a substrate of a first conductivity type. A pixel separating region of the first conductivity type is formed to penetrate through the first semiconductor region to separate the regions of the adjacent photodiodes. A second region of the second conductivity type used to drain excess charge is formed in substrate at a position away from the junction surface between substrate and the first region and below the junction surface.

7 Claims, 4 Drawing Sheets

SOLID-STATE SENSOR AND MANUFACTURING METHOD THEREOF

TECHNICAL FIELD

The present invention pertains to a sensor and, more particularly, to a sensor having photodiodes and its manufacturing method.

BACKGROUND

A photodiode is a diode that generates electric current upon receiving light. Photodiodes widely used as a light-receiving element for Charge Coupled Device (CCD) sensors, CMOS sensors, or other solid-state sensor. A photodiode is made up of pn junction semiconductors. When the pn junction is reverse-biased and a high electric field is applied, the depletion layer widens. Incident light is absorbed mainly in the depletion layer and generates electron-hole pairs. The obtained charge is held by the potential generated in the photodiode and is detected as current or voltage. In a solid-state sensors, pixels having diodes with this configuration are arranged in an array.

When a pixel is irradiated with high intensity light, the charge generated by this irradiation will overflow from the pixel to adjacent pixels if the photocharge exceeds the charge storage capacity of the photodiode. This phenomenon is known as blooming. For solid-state sensors, overflow drains that drain the excess photocharge that had saturated a pixel are widely used as an anti-blooming structures. Overflow drains include lateral overflow drains or LOD that drain the excess photocharge in the in-plane direction of the principal surface of a substrate and vertical overflow drains or VOD that discharge the photocharge in the direction perpendicular to the principal surface of the substrate and toward the substrate.

Turning to FIG. 1A, an example of a conventional solid-state sensor 100 having LODs can be seen. Sensor 100 generally comprises pixels 102-1, 102-2, and 102-3 arranged in a row. Each of these pixels 102-1, 102-2, and 102-3 includes photodiodes 110-1 and 110-2-1, 110-1 and 110-2-2, and 110-1 and 110-2-3 that are separated by pixel separating regions 106-1 and 106-2. Within each of the barrier regions 106-1 and 106-2 are (respectively) n-type regions 108-1 and 108-2 and p-type regions 110-1 and 110-2 that operate as LODs.

As can be seen in FIG. 1B (which is a cross-sectional view along A-A of sensor 100), sensor is comprised of a layered semiconductor materials. Generally, an n-type region or layer 114 and p-type region or layer 116 are formed on or over p-type substrate 112 to form a pn junction that constitutes photodiodes 110-1 and 110-2-1, 110-1 and 110-2-2, and 110-1 and 110-2-3 that are adjacent to one another. The barrier regions 106-1 and 106-2 are formed between adjacent photodiodes 110-1 and 110-2-1, 110-1 and 110-2-2, and 110-1 and 110-2-3, each with an LOD having an n-type region 108-1 and 108-2 bordered by a p-type region 110-1 and 110-2 formed along the perimeter.

Turning FIG. 1C is a potential diagram for the cross-sectional view of FIG. 1B is shown. As shown, a potential well is formed between the adjacent photodiodes 110-1 and 110-2-1, 110-1 and 110-2-2, and 110-1 and 110-2-3, with the peaks $P_1$ and $P_2$ begin located respectively at the junctions between the photodiodes 110-1 and 110-2-1, 110-1 and 110-2-2, 110-1 and 110-2-3 and the barrier regions 106-1 and 106-2 and at the center of the barrier regions 106-1 and 106-2. Thus, photocharge (photoelectrons) can be stored in photodiodes 104-1, 104-2, and 104-3.

In operation, a predetermined voltage can be applied to the n-type regions 108-1 and 108-2. As indicated by potential $P_2$ in FIG. 1C, the potential of the n-type regions 108-1 and 108-2 are shifted to the high potential side. At the same time, the barrier of the potential of the p-type regions 110-1 and 110-2 are modulated to the high potential side. At that time, when the charge C stored in the potential valley on the photodiodes 104-1, 104-2, and 104-3 sides overflows, the charge will pass the potential barrier of the p-type region 110-1 and 110-2 part to drain into n-type region 108-1 and 108-2.

The LOD with this configuration is used to drain the charge. It is insensitive to the storage of charge or light. Consequently, in order to increase the sensitivity of the photodiode, and hence the sensitivity of the solid-state sensor, it is desired to form it with a layout that is as small as possible. However, miniaturization is difficult since p-type regions 110-1 and 110-2 act as the barriers formed around n-type regions 108-1 and 108-2, which act as the drain. Consequently, the width of the LOD region becomes larger than the width of barrier regions 106-1 and 106-2 as shown in FIG. 1A, which leads to a decrease in the sensitivity of the photodiode and solid-state sensor and a decrease in storage capacity.

Therefore, there is a need for an improved solid-state sensor.

SUMMARY

This and other objects and features are predetermined in accordance with one aspect of the present invention by a solid-state sensor formed by arranging plural photodiodes separated by pixel separating regions in an array pattern, characterized by having a semiconductor substrate of a first conductivity type, a first region of a second conductivity type formed on the principal surface of the semiconductor substrate, a pixel separating region of the first conductivity type formed to penetrate through the first region to separate the adjacent regions of the photodiodes, a second region of the second conductivity type that is separated from the junction surface between the semiconductor substrate and the first region and is formed in the semiconductor substrate below the junction surface and is used to drain excess charge.

For the solid-state sensor of the present invention, the first region of the second conductivity type is formed on the principal surface of the semiconductor substrate of the first conductivity type. The pixel separating region of the first conductivity type is formed to penetrate through the first region to separate the adjacent regions of the photodiodes. The second region of the second conductivity type is separated from the junction surface between the semiconductor substrate and the first region and is formed in the semiconductor substrate below the junction surface and is used to drain excess charge. For the solid-state sensor of an aspect of the present invention, the second region is formed below the pixel separating region. Also, a third region of the first conductivity type may be formed on the surface layer of the first semiconductor region.

Another aspect of the present invention provides a semiconductor device on which photodiodes are formed, characterized by having a semiconductor substrate of a first conductivity type, a first region of a second conductivity type formed on the principal surface of the semiconductor substrate, and a second region of the second conductivity type that is separated from the junction surface between the semiconductor substrate and the first region and is formed in the semiconductor substrate below the junction surface and is used to drain excess charge.

For the semiconductor device of the present invention, the first region of the second conductivity type is formed on the principal surface of the semiconductor substrate of the first conductivity type, and the second region of the second conductivity type is separated from the junction surface between the semiconductor substrate and the first region and is formed in the semiconductor substrate below the junction surface and is used to drain excess charge. For the semiconductor device of an aspect of the present invention, a third region of the first conductivity type may be formed on the surface layer of the first semiconductor region.

Also, an aspect of the present invention provides a solid-state sensor manufacturing method used for manufacturing a solid-state sensor formed by arranging plural photodiodes separated by pixel separating regions in an array, characterized by having the following steps: a first region of a second conductivity type is formed on the principal surface of a semiconductor substrate of a first conductivity type; a pixel separating region of the first conductivity type is formed to penetrate through the first region to separate the adjacent regions of the photodiodes; a second region of the second conductivity type used to drain excess charge is formed away from the junction surface between the semiconductor substrate and the first region in the semiconductor substrate below the junction surface.

In the solid-state sensor manufacturing method according to an aspect of the present invention, the first region of the second conductivity type is formed on the principal surface of the semiconductor substrate of the first conductivity type, and the pixel separating region of the first conductivity type is formed to penetrate through the first region to separate the regions of the adjacent photodiodes. Also, the second region of the second conductivity type is separated from the junction surface between the semiconductor substrate and the first region and is formed in the semiconductor substrate below the junction surface and is used to drain excess charge.

In the solid-state sensor manufacturing method of an aspect of the present invention, the second region may be formed below the pixel separating region in the step used to form the second semiconductor region. In addition, the method may also contain a step for forming a third region of the first conductivity type on the surface layer of the semiconductor region.

Also, an aspect of the present invention provides a semiconductor device manufacturing method for manufacturing a semiconductor device on which photodiodes are formed, characterized by the following steps: a first region of a second conductivity type is formed on the principal surface of a semiconductor substrate of a first conductivity type; and a second region of the second conductivity type is separated from the junction surface between the semiconductor substrate and the first region and is formed in the semiconductor substrate below the junction surface and is used to drain excess charge.

In the semiconductor device manufacturing method according to an aspect of the present invention, the first region of the second conductivity type is formed on the principal surface of the semiconductor substrate of the first conductivity type, and the second region of the second conductivity type is separated from the junction surface between the semiconductor substrate and the first region and is formed in the semiconductor substrate below the junction surface and is used to drain excess charge.

The semiconductor device manufacturing method according to an aspect of an aspect of the present invention may also contain a step for forming a third region of the first conductivity type on the surface layer of the semiconductor region.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 4A along D-D.

DETAILED DESCRIPTION

Figure 1A:
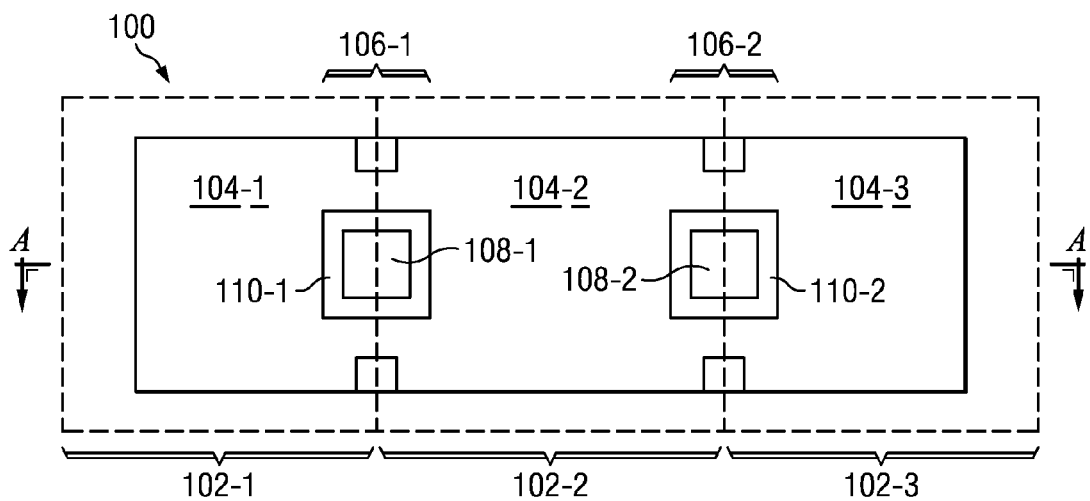
FIG. 1A is a plan view of an example of a conventional solid-state sensor.
Figure 1B:
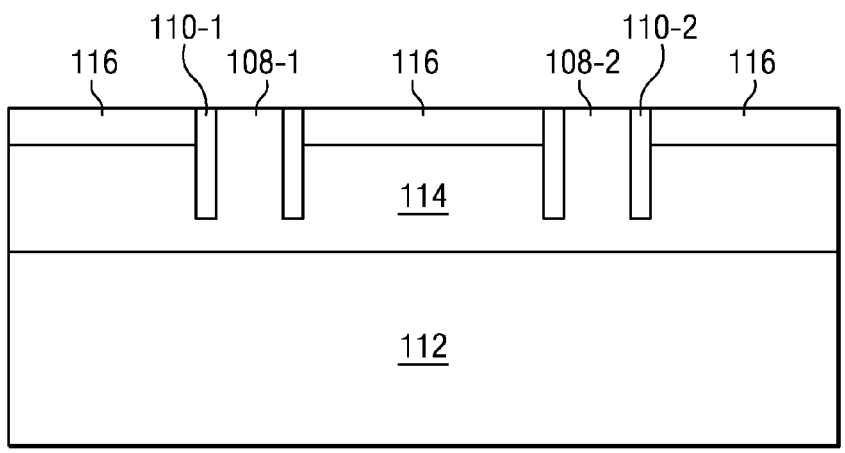
FIG. 1B is a cross-sectional view of the solid-state sensor of FIG. 1 along A-A.
Figure 1C:
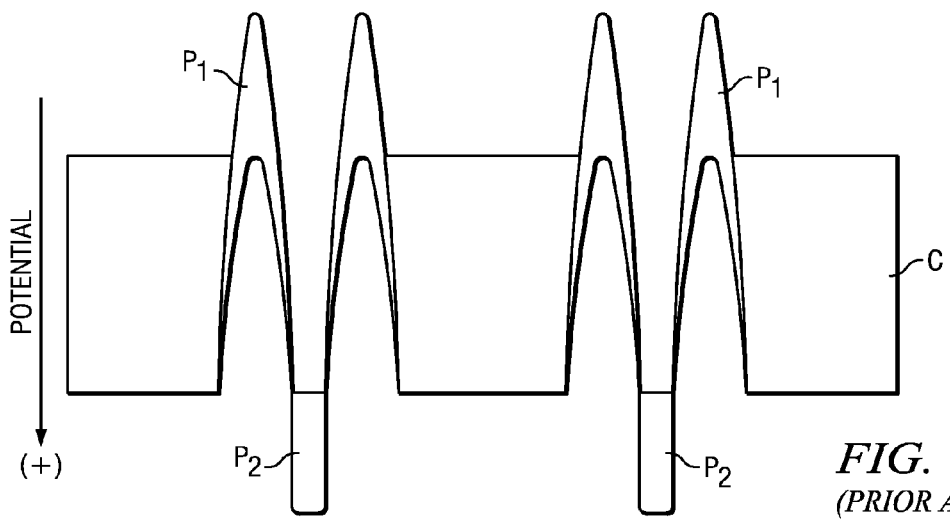
FIG. 1C is a potential diagram for the solid-state sensor of FIGS. 1A and 1B.

Refer now to the drawings wherein depicted elements are, for the sake of clarity, not necessarily shown to scale and wherein like or similar elements are designated by the same reference numeral through the several views.

For the solid-state sensor of an aspect of the present invention, the second region of the second conductivity type is formed as a region for draining excess charge in the semiconductor substrate away from the junction surface between the semiconductor substrate and the first region at a location below the junction surface. The width of the pixel separating region can be set to the smallest level required. In this way, the sensitivity of the photodiodes that constitute the solid-state sensor can be improved and the storage capacity increased.

For the semiconductor device of an aspect of the present invention, the second region of the second conductivity type is formed as a region for draining excess charge in the semiconductor substrate away from the junction surface between the semiconductor substrate and the first region below the junction surface. The width of the region that separates the photodiodes can be set to the smallest level required. In this way, the sensitivity of the photodiodes can be improved and the storage capacity increased.

According to the solid-state sensor manufacturing method of an aspect of the present invention, since the second region of the second conductivity type is formed as a region for draining excess charge in the semiconductor substrate away from the junction surface between the semiconductor substrate and the first region below the junction surface, the width of the pixel separating region can be set to the smallest level required. In this way, the sensitivity of the photodiodes that constitute the solid-state sensor can be improved and the storage capacity increased.

According to the semiconductor device manufacturing method of an aspect of the present invention, since the second region of the second conductivity type is formed as a region for draining excess charge in the semiconductor substrate away from the junction surface between the semiconductor substrate and the first region below the junction surface, the width of the region that separates the photodiodes can be set to the smallest level required. In this way, the sensitivity of the photodiodes can be improved and the storage capacity increased.

Figure 2A:
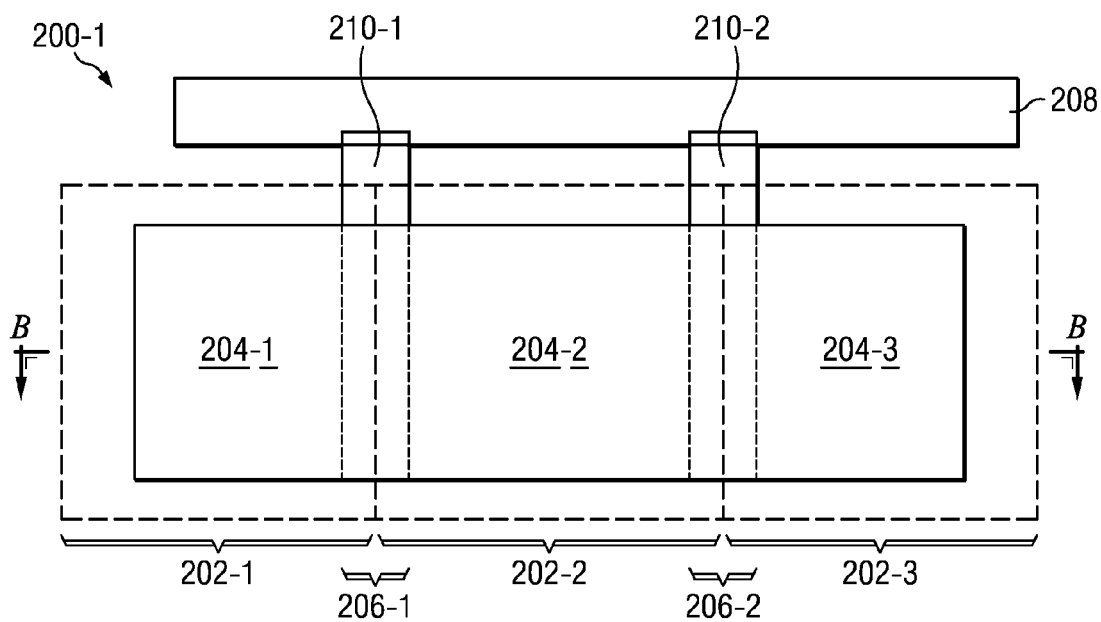
FIG. 2A is the plan view of an example of the solid-state sensor according to an aspect of the present invention.

Turning to FIG. 2A, an example of a solid-state sensor 200-1 in accordance with an aspect of the present invention can be seen. The solid-state sensor 200 generally comprises a plurality of pixels 202-1 through 202-3 arranged in an array pattern. For example, three pixels 202-1 through 202-3 are shown. In particular, this arrangement includes, photodiodes 204-1 through 204-2 separated from one another by barrier regions 206-1 and 206-2. These barrier regions 206-1 and 206-2 generally include buried regions 210-1 and 210-2 (which are generally n-type regions) that are coupled to n-type region 208, where a potential of several voltage can be applied to region 208.

Figure 2B:
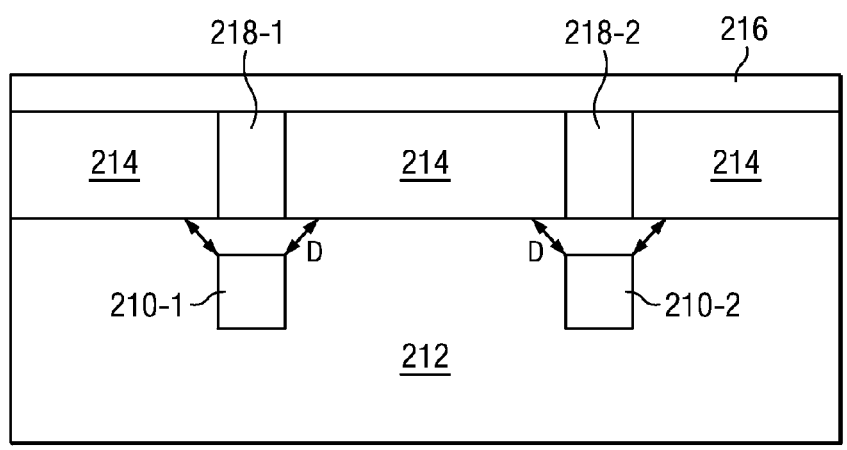
FIG. 2B is the cross-sectional view of the solid-state sensor of FIG. 2A along B-B.

Now turning to FIG. 2B, a cross-sectional view of the sensor 200-1 along B-B can be seen. Here, n-type region or layer 214 is formed on or over p-type substrate 212 to form a pn junction that generally comprises photodiodes 204-1 through 204-3. P-type separating regions 218-1 and 218-2 is formed (as part of barrier regions 206-1 and 206-2) through n-type region 214 to separate the regions of the adjacent photodiodes 204-1 through 204-3. Also, for example, the n-type buried regions 210-1 and 210-2 are formed at a predetermined distance D away from the junction surface between p-type substrate 212 and n-type region 214 in p-type substrate 212 below the junction surface and generally coextensive with at least a portion of p-type regions 218-1 and 218-2. Also, for example, p-type region 216 is formed on or over n-type region 214.

Figure 2C:
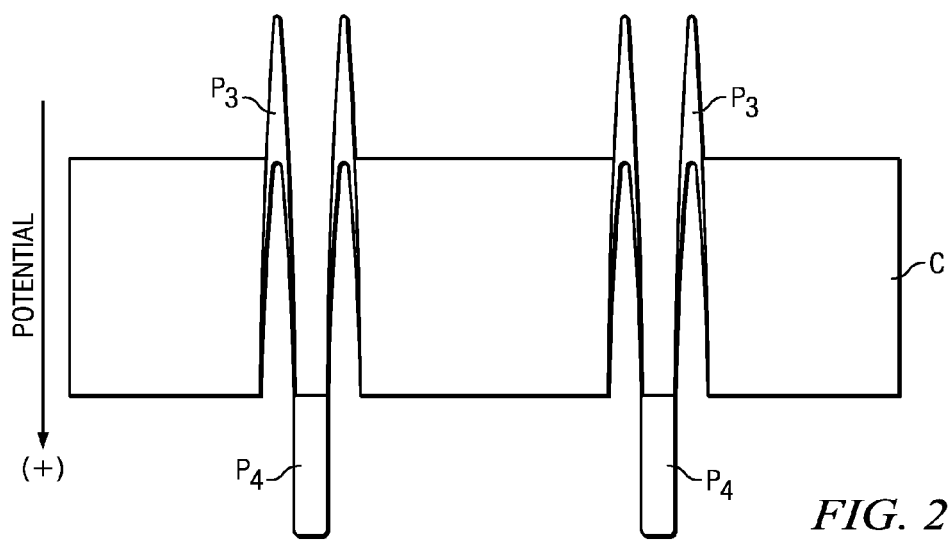
FIG. 2C is a potential diagram for the solid-state sensor of FIGS. 2A and 2B.

In FIG. 2C, a potential diagram for sensor 200-1 can be seen. Here, as shown by potential $P_3$, a potential barrier is formed between barrier regions 206-1 and 206-2 and photodiodes 204-1 through 204-3. The photocharge (photoelectrons) is stored in the potential valley on the photodiode side. When a predetermined voltage is applied to n-type regions 210-1 and 210-2 via n-type region 208, the potential in the regions where n-type regions 210-1 and 210-2 are formed is shifted to the high potential side. At the same time, the barrier of the potential at the position adjacent to n-type regions 210-1 and 210-2 is modulated to the high potential side. If charge C stored in the potential valley on the photodiode side overflows, the charge passes the potential barrier at the position adjacent to n-type regions 210-1 and 210-2 and drains into n-type regions 210-1 and 210-2.

Figure 3A:
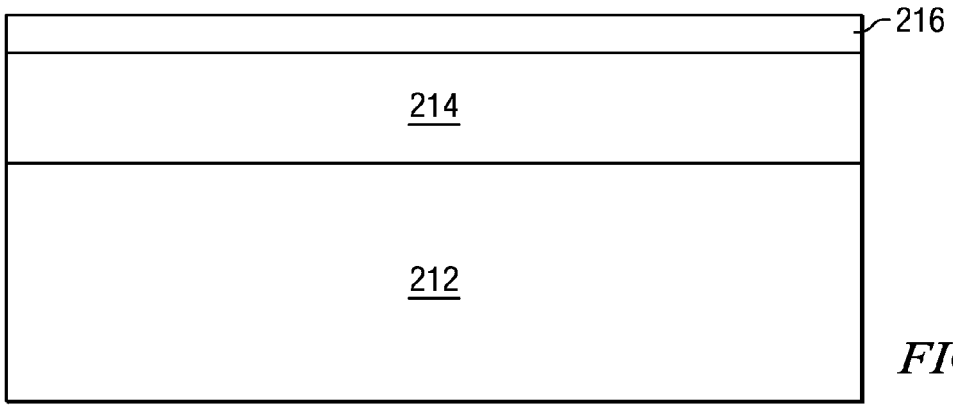
FIGS. 3A through 3C are cross-sectional views illustrating the process of the method for manufacturing the solid-state sensor of FIGS. 2A and 2B.
Figure 3B:
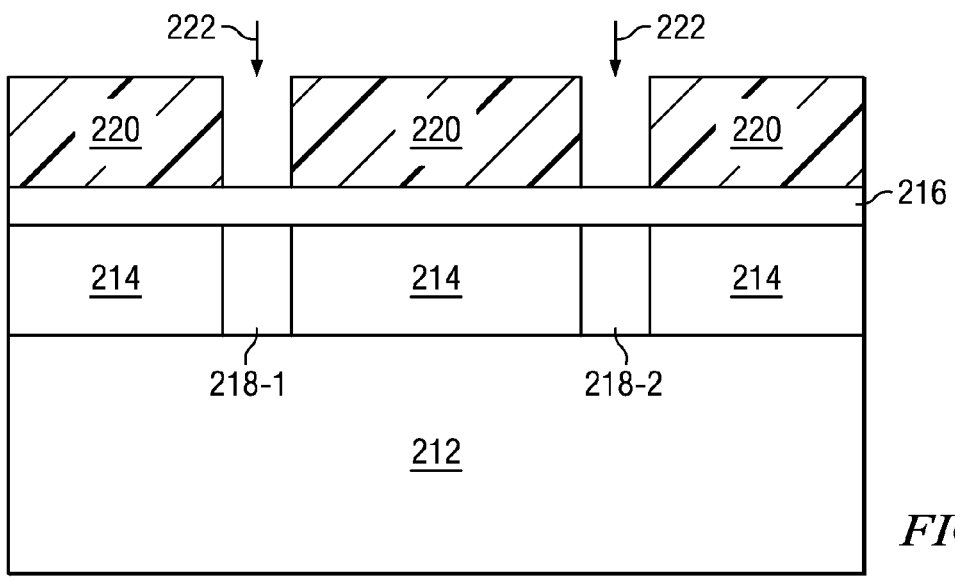
Figure 3C:
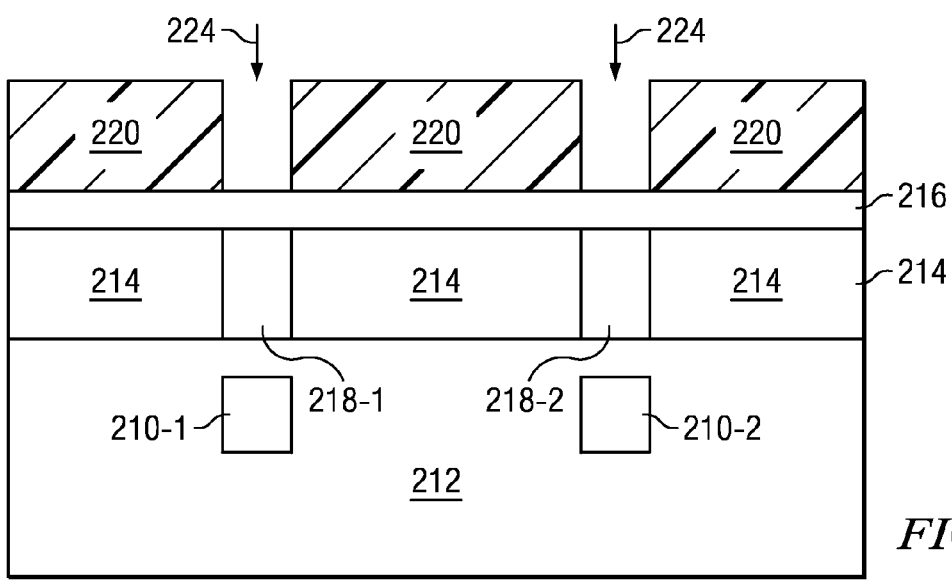

For the solid-state sensor 200-1 n-type regions 210-1 and 210-2 are formed as a region for draining excess charge in the p-type substrate 212 at a location away from the junction surface of p-type substrate 212 and n-type region 214 and below the junction surface. Since the conventional LOD is not needed, the width of regions 218-1 and 218-2 can be set to the minimum level required. Thus, the sensitivity of the photodiodes 202-1 through 202-3 can be improved and the storage capacity increased. Also, since the solid-sate sensor 200-1 can be constituted using a p-type substrate, the sensitivity on the long wavelength side can be increased. For example, the sensitivity with respect to light with a wavelength of 700 nm is twice as high as that of a photodiode using an n-type substrate having the conventional VOD. Also, in the simulation for 3×3 μm pixels, the solid-state sensor 200-1 showed a 20% increase in both sensitivity and charge storage capacity compared with the solid-state sensor using the conventional LOD Now turning to FIGS. 3A through 3C, a method of manufacturing the sensor 200-1 is shown. First, as shown in FIG. 3A, n-type region or layer 214 is formed on p-type substrate 212, and p-type region or layer 216 is formed on n-type region 214. Next, as shown in FIG. 3B, for example, a resist film or layer 220 is formed on region 216 and patterned to form openings for the formation of the barrier regions 206-1 and 206-2 by means of photolithography. By implanting ions 222 of a p-type impurity, p-type regions 218-1 and 218-2 are formed in n-type region 214 to separate adjacent photodiodes. Next, as shown in FIG. 3C, for example, the patterned resist film 220 is again used, and ions 224 of an n-type impurity are implanted at a higher energy level than that used for ions 222 to form separating regions 218-1 and 218-2. As a result, n-type buried regions 210-1 and 210-2 is formed as a region for draining excess charge in substrate 212 at a position away from the junction surface between p-type substrate 212 and n-type region 214 and below the junction surface. As shown in FIG. 3C, when separating regions 218-1 and 218-2 and n-type regions 210-1 and 210-2 are formed using the resist film 13, n-type regions 210-1 and 210-2 can be formed easily below separating regions 218-1 and 218-2. For example, the side surface of n-type regions 210-1 and 210-2 can be positioned on almost the same plane as (generally coextensive with at least a portion of) the side surface of separating regions 218-1 and 218-2. In fact, since the impurities of n-type regions 210-1 and 210-2 implanted into the lower levels have a higher degree of diffusion, there might be an interposed part between n-type region 214 and n-type regions 210-1 and 210-2. This, however, does not change the fact that the potential shown in FIG. 2C can be obtained so that the desired overflow drain function can be realized.

Figure 4A:
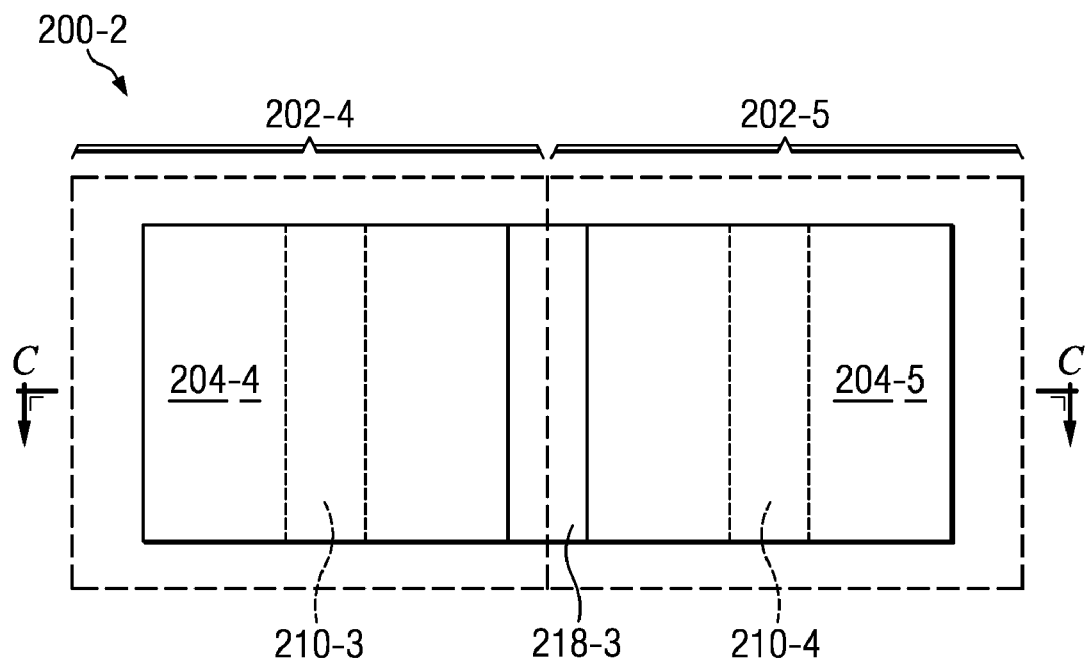
FIG. 4A is the plan view of an example of solid-state sensor according to an aspect of the present invention.
Figure 4B:
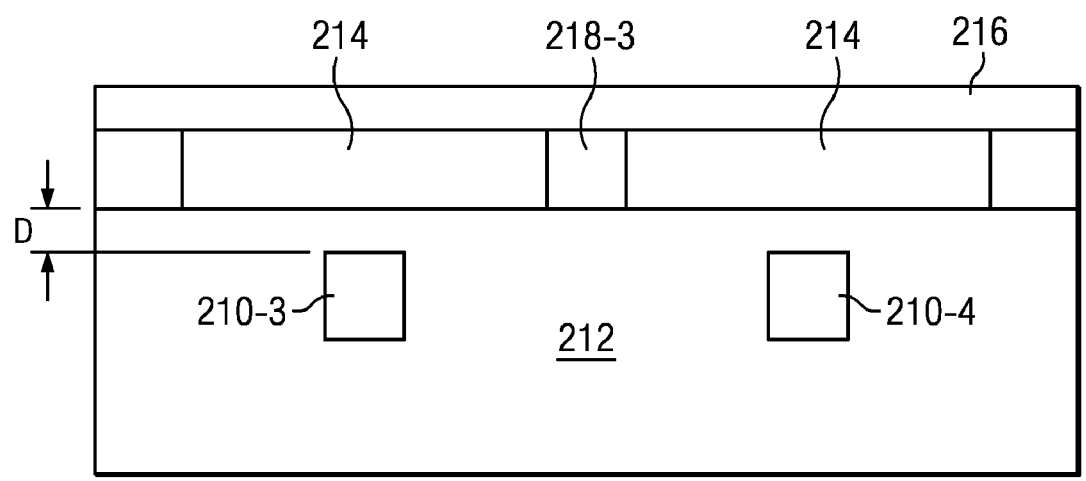
FIG. 4B is the cross-sectional view of the solid-state sensor of FIG.

In FIGS. 4A and 4B, solid-state sensor 200-2 in accordance with an aspect of the present invention can be seen. Unlike the sensor 200-1, n-type regions 210-3 and 210-4 are used as the regions for draining excess charge is formed below n-type region 214 instead of below separating region 218-3. Here, n-type regions 210-3 and 210-4 are also formed at a predetermined distance D away from the junction surface between p-type substrate 212 and n-type region 214 and below the junction surface. In the solid-state sensor 200-2, a potential barrier can also be formed for the charge located at a predetermined distance D away from the junction surface. The height of the barrier is modulated by the potential applied to n-type regions 210-3 and 210-4. Since the conventional LOD is not needed, the width of pixel separating region 14 can be set to the minimum level required. In this way, the sensitivity of the photodiodes that constitute the solid-state sensor can be improved and the storage capacity increased.

The present invention is not limited to the explanation above. For example, the present invention can be applied not only to CCD sensor and other solid-state sensors but also to all kinds of semiconductor devices having photodiodes. That is, a first region of a second conductivity type is formed on the principal surface of a semiconductor substrate of a first conductivity type, and a second region of the second conductivity type is formed as a region for draining excess charge in the semiconductor substrate at a position away from the junction surface between the semiconductor substrate and the first region and below the junction surface.

The semiconductor device can be manufactured by forming a first region of a second conductivity type on the principal surface of a semiconductor substrate of a first conductivity type and forming a second region of the second conductivity type as a region for draining excess charge in the semiconductor substrate at a position away from the junction surface between the semiconductor substrate and the first region and below the junction surface.

Other changes can be made as long as they do not deviate from the main point of the present invention. The solid-state sensor of the present invention can be used for CCD sensors, CMOS sensors, or other solid-state sensors. Also, the semiconductor device of the present invention can be used for semiconductor devices that contain photodiodes. The solid-state sensor manufacturing method of the present invention can be used to manufacture CCD sensors, CMOS sensors, or other solid-state sensors. Also, the semiconductor device manufacturing method of the present invention can be used to manufacture semiconductor devices that contain photodiodes.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. A method for manufacturing a plurality of photodiodes that are arranged in an array, the method comprising:
   providing a substrate of a first conduction type;
   forming a first layer of a second conduction type on the substrate;
   forming a second layer of the first conduction type on the first layer;
   forming a resist layer on the second layer;
   patterning the resist layer;
   implanting a first dopant at a first energy level through the patterned resist to form a plurality of separating regions of the first conduction type in the first layer to separate adjacent photodiodes; and
   implanting a second dopant at a second energy level through the patterned resist to form a plurality of buried regions of the second conduction type within the substrate, wherein the buried regions are formed at a predetermined distance below and spaced apart from the junction between the substrate and the first layer.

2. The method of claim 1, wherein the first conduction type is p-type and the second conduction type is n-type.

3. The method of claim 1, wherein the resist layer is pattered by photolithography.

4. The method of claim 1, wherein the method further comprises forming an intersection region of the second conductivity type, wherein the intersection region is connected to the buried region.

5. The method of claim 1, wherein each buried region is generally coextensive with the at least one of the separating regions.

6. A method for manufacturing a plurality of photodiodes that are arranged in an array, the method comprising:
   providing a p-type substrate;
   forming an n-type layer on the substrate;
   forming a p-type layer on the n-type layer;
   forming a resist layer on the p-type layer;
   patterning the resist layer by photolithography;
   implanting a p-type dopant at a first energy level through the patterned resist to form a plurality of p-type separating regions in the n-type layer to separate adjacent photodiodes;
   implanting an n-type dopant at a second energy level through the patterned resist to form a plurality of n-type buried regions within the p-type substrate, wherein the buried regions are formed at a predetermined distance below and spaced apart from the junction between the p-type substrate and the n-type layer, wherein the second energy level is greater than the first energy level; and
   forming an n-type intersecting layer, wherein the intersecting layer is connected to each of the buried regions.

7. The method of claim 6, wherein each buried region is generally coextensive with the at least one of the separating regions.

* * * * *